(12) United States Patent
Kashima

(10) Patent No.: US 10,578,942 B2
(45) Date of Patent: Mar. 3, 2020

(54) DEVICE AND OPERATION METHOD AND MANUFACTURING METHOD THEREOF

(71) Applicant: BOE TECHNOLOGY GROUP CO., LTD., Beijing (CN)

(72) Inventor: Miki Kashima, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 15/866,070

(22) Filed: Jan. 9, 2018

(65) Prior Publication Data
US 2018/0210253 A1 Jul. 26, 2018

(30) Foreign Application Priority Data

Jan. 23, 2017 (CN) .......................... 2017 1 0058547

(51) Int. Cl.
*G02F 1/139* (2006.01)
*G02F 1/1334* (2006.01)
*G02F 1/137* (2006.01)
*G02F 1/1347* (2006.01)
*H01L 27/32* (2006.01)

(52) U.S. Cl.
CPC .......... *G02F 1/1396* (2013.01); *G02F 1/1334* (2013.01); *G02F 1/13475* (2013.01); *G02F 1/13718* (2013.01); *G02F 1/13737* (2013.01); *H01L 27/3232* (2013.01)

(58) Field of Classification Search
CPC .. G02F 1/13475; G02F 1/1347; G02F 1/1334; G02F 2001/13345; G02F 1/1396; G02F 1/13737; H01L 27/3232; H01L 27/3225
See application file for complete search history.

(56) References Cited

U.S. PATENT DOCUMENTS

| 6,481,851 B1 | 11/2002 | McNelley et al. |
| 6,762,436 B1 | 7/2004 | Huang et al. |
| 2009/0102763 A1 | 4/2009 | Border et al. |
| 2010/0060825 A1* | 3/2010 | Jang ................... B82Y 20/00 349/86 |

(Continued)

FOREIGN PATENT DOCUMENTS

| CN | 1173687 A | 2/1998 |
| CN | 1366791 A | 8/2002 |

(Continued)

*Primary Examiner* — Jia X Pan
(74) *Attorney, Agent, or Firm* — Foley & Lardner LLP; James F. Ewing; Paul M. H. Pua

(57) ABSTRACT

The present disclosure relates to device, and operation method and manufacturing method thereof, wherein the device comprises a dichroic dye composite layer, a first liquid crystal display (LCD) composite layer, a wide waveband reflective composite layer and an organic light emitting diode (OLED) composite layer stacked in this order, wherein the dichroic dye composite layer is switchable between a black state and a transparent state, the liquid crystal display (LCD) composite layer is switchable between a display state, a transparent state and a dark state, the wide waveband reflective composite layer is switchable between a transparent state and a mirror state, and the organic light emitting diode (OLED) composite layer is switchable between a light-emitting state and a transparent state.

19 Claims, 1 Drawing Sheet

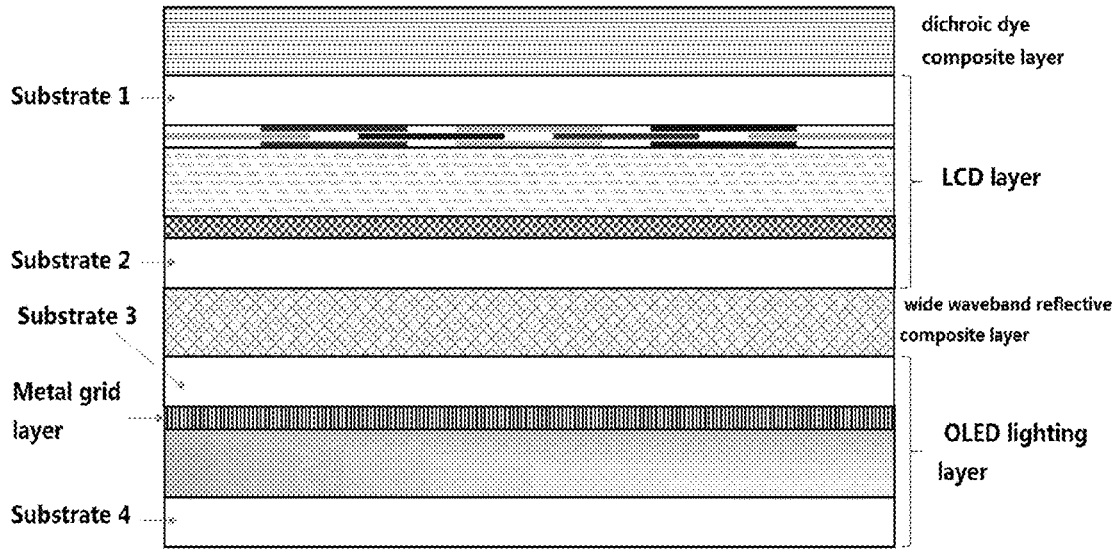

(56) References Cited

U.S. PATENT DOCUMENTS

| | | | |
|---|---|---|---|
| 2010/0097469 A1 | 4/2010 | Blank et al. | |
| 2012/0212523 A1* | 8/2012 | Yamauchi | G03B 21/60 345/697 |
| 2016/0320644 A1* | 11/2016 | Kim | G02F 1/1334 |
| 2017/0138120 A1* | 5/2017 | Suzuka | G02F 1/1334 |
| 2017/0261782 A1* | 9/2017 | Lee | G02F 1/1334 |

FOREIGN PATENT DOCUMENTS

| | | |
|---|---|---|
| CN | 1873499 A | 12/2006 |
| CN | 2876961 Y | 3/2007 |
| CN | 101369070 A | 2/2009 |
| CN | 101809489 A | 8/2010 |
| CN | 101978779 A | 2/2011 |
| CN | 104335679 A | 2/2015 |
| CN | 105633299 A | 6/2016 |

* cited by examiner

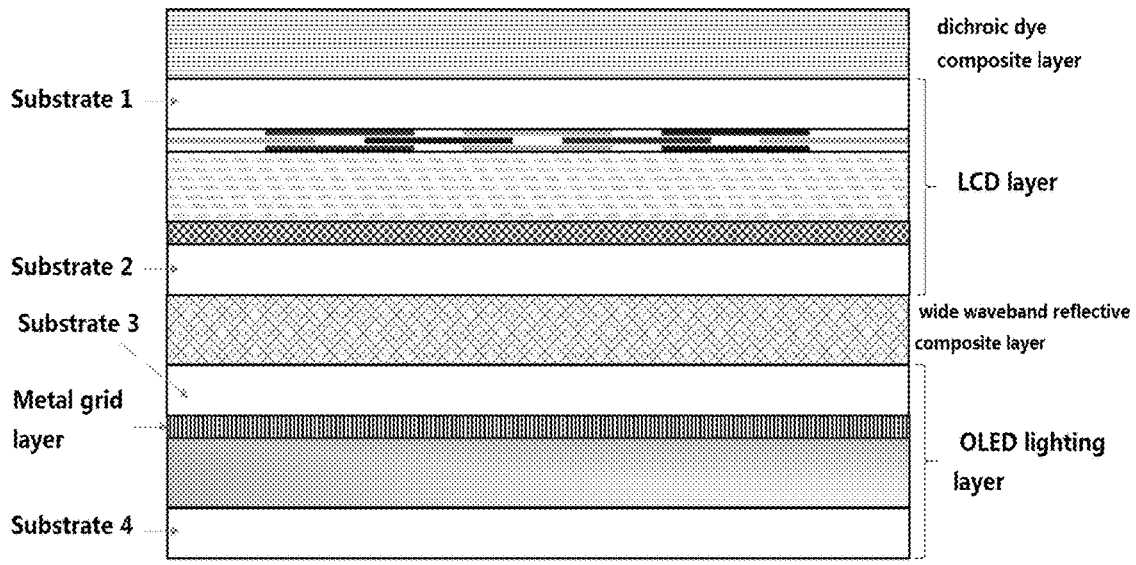

Fig. 1

|  | State 1 | State 2 | State 3 | State 4 | State 5 |
|---|---|---|---|---|---|
| Dichroic layer | Black state | Transparent | Black state | Transparent | Transparent |
| LCD layer | Display state | Transparent | Dark state | Transparent | Transparent |
| Wide waveband reflective layer | Transparent | Transparent | Mirror | Mirror | Mirror |
| OLED lighting layer | Light-emitting | Light-emitting | Light-emitting | Light-emitting | Transparent |
| Upper side (the side of the dichroic layer) | Display | Lighting | black | Mirror | Mirror |
| Lower side (the side of the OLED lighting layer) | Lighting | Lighting | Lighting | Lighting | Mirror |

Fig.2

DEVICE AND OPERATION METHOD AND MANUFACTURING METHOD THEREOF

CROSS REFERENCE TO THE RELATED APPLICATIONS

The present disclosure claims the benefit of Chinese Patent Application No. 201710058547.0 filed on Jan. 23, 2017, the entire contents of which are incorporated herein by reference as a part of the present disclosure.

FIELD OF THE DISCLOSURE

The present disclosure relates to device, and operation method and manufacturing method thereof.

BACKGROUND

OLED is a kind of thin film light emitting diode, and its emitting layer is organic material. As compared with conventional LEDs, OLED devices have low processing cost, and can be used with display screens and lamps. OLED lighting layer can be made as a planar lighting source, which has advantages such as power consumption, ultrathin and flexible.

Cholesteric liquid crystal, like other liquid crystal materials, not only has fluidity, deformation and viscosity of the liquid, but also has optical anisotropy of the crystal, and thus is an excellent nonlinear optical material. Due to the special molecular structure and optical anisotropy of the cholesteric liquid crystal, it has optical activity and polarization dichroism of the crystal and its inherent properties such as selective optical scattering.

SUMMARY

The present disclosure achieves independently switching a lighting state, a display state, and a mirror state on both sides of the device, by using a specific stack structure and control method of OLED lighting layer, LCD layer, dichroic dye composite layer and reflective composite layer.

According to a first aspect of the present disclosure, a device is provided, comprising a dichroic dye composite layer, a first liquid crystal display (LCD) composite layer, a wide waveband reflective composite layer and an organic light emitting diode (OLED) composite layer stacked in this order, wherein the dichroic dye composite layer is switchable between a black state and a transparent state, the first liquid crystal display (LCD) composite layer is switchable between a display state, a transparent state and a dark state, the wide waveband reflective composite layer is switchable between a transparent state and a mirror state, and the organic light emitting diode (OLED) composite layer is switchable between a light-emitting state and a transparent state, wherein the dichroic dye composite layer comprises a dichroic dye layer and dichroic dye layer transparent electrodes on both sides thereof, and wherein the wide waveband reflective composite layer comprises a wide waveband reflective layer and wide waveband reflective layer transparent electrodes on both sides thereof.

According to a second aspect of the present disclosure, a operation method of the device according to the first aspect of the present disclosure is provided, comprising at least one of:

switching the dichroic dye composite layer to a black state, switching the first liquid crystal display (LCD) composite layer to a display state, switching the wide waveband reflective composite layer to a transparent state, and switching the organic light emitting diode (OLED) composite layer to a light-emitting state, such that a display state is achieved on a first liquid crystal display (LCD) composite layer side, and a lighting state is achieved on an organic light emitting diode (OLED) composite layer side;

switching the dichroic dye composite layer to a transparent state, switching the first liquid crystal display (LCD) composite layer to a transparent state, switching the wide waveband reflective composite layer to a transparent state, and switching the organic light emitting diode (OLED) composite layer to a light-emitting state, such that a lighting state is achieved on a first liquid crystal display (LCD) composite layer side, and a lighting state is achieved on an organic light emitting diode (OLED) composite layer side;

switching the dichroic dye composite layer to a black state, switching the first liquid crystal display (LCD) composite layer to a dark state, switching the wide waveband reflective composite layer to a mirror state, and switching the organic light emitting diode (OLED) composite layer to a light-emitting state, such that a black state is achieved on a first liquid crystal display (LCD) composite layer side, and a lighting state is achieved on an organic light emitting diode (OLED) composite layer side;

switching the dichroic dye composite layer to a transparent state, switching the first liquid crystal display (LCD) composite layer to a transparent state, switching the wide waveband reflective composite layer to a mirror state, and switching the organic light emitting diode (OLED) composite layer to a light-emitting state, such that a mirror state is achieved on a first liquid crystal display (LCD) composite layer side, and a lighting state is achieved on an organic light emitting diode (OLED) composite layer side; or switching the dichroic dye composite layer to a transparent state, switching the first liquid crystal display (LCD) composite layer to a transparent state, switching the wide waveband reflective composite layer to a mirror state, and switching the organic light emitting diode (OLED) composite layer to a transparent state, such that a mirror state is achieved on a first liquid crystal display (LCD) composite layer side, and a mirror state is achieved on an organic light emitting diode (OLED) composite layer side.

In the embodiments of the present disclosure, when the device comprises a second liquid crystal display (LCD) composite layer, the operation method of the device comprises at least one of:

switching the dichroic dye composite layer to a black state, switching the first liquid crystal display (LCD) composite layer to a display state, switching the wide waveband reflective composite layer to a transparent state, switching the organic light emitting diode (OLED) composite layer to a light-emitting state, and switching the second liquid crystal display (LCD) composite layer to a display state, such that a display state is achieved on a first liquid crystal display (LCD) composite layer side, and a display state independent from a first liquid crystal display (LCD) composite layer side is achieved on a second liquid crystal display (LCD) composite layer side;

switching the dichroic dye composite layer to a transparent state, switching the first liquid crystal display (LCD) composite layer to a transparent state, switching the wide waveband reflective composite layer to a transparent state, switching the organic light emitting diode (OLED) composite layer to a light-emitting state, and switching the second liquid crystal display (LCD) composite layer to a display state, such that a lighting state is achieved on a first liquid crystal display (LCD) composite layer side, and a display state is achieved on a second liquid crystal display (LCD) composite layer side;

switching the dichroic dye composite layer to a black state, switching the first liquid crystal display (LCD) composite layer to a dark state, switching the wide waveband reflective composite layer to a mirror state, switching the organic light emitting diode (OLED) composite layer to a light-emitting state, and switching the second liquid crystal display (LCD) composite layer to a display state, such that a black state is achieved on a first liquid crystal display (LCD) composite layer side, and a display state is achieved on a second liquid crystal display (LCD) composite layer side; or switching the dichroic dye composite layer to a transparent state, switching the first liquid crystal display (LCD) composite layer to a transparent state, switching the wide waveband reflective composite layer to a mirror state, switching the organic light emitting diode (OLED) composite layer to a light-emitting state, and switching the second liquid crystal display (LCD) composite layer to a display state, such that a mirror state is achieved on a first liquid crystal display (LCD) composite layer side, and a display state is achieved on a second liquid crystal display (LCD) composite layer side.

In the embodiments of the present disclosure, when the device comprises a second liquid crystal display (LCD) composite layer, the device can also achieve the various states in the device according to the first aspect of the present disclosure, wherein it is only needed to switch the second liquid crystal display (LCD) composite layer to a transparent state, and the detailed states of the various layers are omitted here.

According to a third aspect of the present disclosure, a method of manufacturing the device according to the first aspect of the present disclosure is provided, the method comprising:

forming a first thin film transistor on an upper side of a second substrate;

providing a dichroic dye composite layer on an upper side of a first substrate, wherein the first substrate is above the second substrate;

providing a transparent electrode and an alignment layer on both sides of the first substrate and the second substrate which face each other, and perfusing a liquid crystal layer therebetween;

providing a wide waveband reflective composite layer on a lower side of the second substrate;

providing a third substrate on a lower side of the wide waveband reflective composite layer;

providing a first metal grid layer on a lower side of the third substrate;

providing an OLED lighting layer on a lower side of the first metal grid layer; and providing a fourth substrate on a lower side of the OLED lighting layer.

BRIEF DESCRIPTION OF THE DRAWINGS

FIG. 1 is a schematic diagram showing a structure of a double-sided multifunctional device according to one or more embodiments of the present disclosure.

FIG. 2 is a schematic diagram showing a display state of a double-sided multifunctional device according to one or more embodiments of the present disclosure.

DETAILED DESCRIPTION

The present disclosure will be described below in detail with reference to the embodiments. Those skilled in the art could appreciate that, the following embodiments are merely used for explaining the objective of the present disclosure but not intended to limit the scope of the present disclosure in any way. The scope of the present disclosure is determined only by the claims.

The present disclosure achieves independently switching a lighting state, a display state, and a mirror state on both sides of the device, by using a specific stack structure and control method of OLED lighting layer, LCD layer, dichroic dye composite layer and reflective composite layer.

FIG. 1 is a schematic diagram showing a structure of a double-sided multifunctional device according to one or more embodiments of the present disclosure.

As shown in FIG. 1, the double-sided multifunctional device is manufactured by the method:

forming a thin film transistor (TFT) on a substrate 2;

providing a color film on a lower side of a substrate 1 and providing a dichroic dye composite layer on an upper side of the substrate 1, wherein the first substrate is above the second substrate;

providing a transparent electrode and an alignment layer on both substrates 1 and 2, and perfusing a nematic liquid crystal layer therebetween;

providing a wide waveband reflective composite layer on a lower side of the substrate 2;

providing a substrate 3 on a lower side of the wide waveband reflective composite layer;

providing a metal grid layer on a lower side of the substrate 3;

providing an OLED lighting layer on a lower side of the metal grid layer; and providing a substrate 4 on a lower side of the OLED lighting layer.

The substrate 1, the substrate 2 and the other layers therebetween form the first LCD composite layer.

In the embodiment of the present disclosure, the dichroic dye composite layer is switchable between a black state and a transparent state, the first liquid crystal display (LCD) composite layer is switchable between a display state, a transparent state and a dark state, the wide waveband reflective composite layer is switchable between a transparent state and a mirror state, and the organic light emitting diode (OLED) composite layer is switchable between a light-emitting state and a transparent state. The dichroic dye composite layer comprises a dichroic dye layer and transparent electrodes of the dichroic dye layer on both sides thereof. The wide waveband reflective composite layer comprises a wide waveband reflective layer and wide waveband reflective layer transparent electrodes on both sides thereof.

The dichroic dye composite layer adopted in the present disclosure is a dichroic dye composite layer formed by sandwiching materials comprising nematic liquid crystal, polymerizable monomer, dichroic dye and photoinitiator between two thin film layers (there are conductive layers on the sides of the two films which are closer to the materials, and the conductive layer is ITO), and then performing ultraviolet light irradiation and polymerization. By means of a difference in refractive index between liquid crystal, dichroic dye and polymer, an optical layer that is transparent while a voltage is applied and is in a black polarization state when no voltage is applied is realized. When a voltage is applied, the liquid crystal molecules are arranged in the direction of an electric field, and the dichroic dye is arranged also in the arrangement direction of the liquid crystal molecules, so the liquid crystal molecules and the dichroic dye and the polymer match in their refractive indexes, i.e., without a difference in refractive index therebetween, and thus a transparent state is presented. When no voltage is applied, the liquid crystal molecules are arranged irregularly, and the same is true with the dichroic dye, so the refractive index of the polymer and those of the liquid crystal molecules and the dichroic dye do not match, a difference in refractive index occurs. As a result, the color of the dichroic dye is presented, which is usually black (but the polarized light can be transmitted therethrough). Therefore, light rays through the dichroic dye layer become polarized light rays in one direction.

Therefore, the black state of the dichroic dye composite layer represents a state in which, in case where no voltage is applied, normal light rays transmitting through the dichroic dye composite layer become a linearly polarized light in one direction, and the transparent state represents a state in which, in case where a voltage is applied, all light rays can transmit through the dichroic dye composite layer without any change.

The polymerization of the dichroic dye layer can form a polymer network. The liquid crystal and dichroic dye can be located in the meshes of the network. The polymerizable monomer can be for example an acrylate monomer. The polymerization may use light polymerization, under a lighting condition of for example 5 J/cm$^2$. The dichroic dye layer may be formed by polymerizing a composition comprising nematic liquid crystal of 40-80 wt %, polymerizable monomer of 19.5-59.5 wt %, and dichroic dye of 0.5-10 wt %, and an additional photo-initiator that is 0.5-3 wt % of the polymerizable monomer.

In the embodiment of the present disclosure, the wide waveband reflective layer utilizes a pitch of the cholesteric liquid crystal to achieve its optical properties. The optical transmissive and selective optical scattering properties of the cholesteric liquid crystal are determined mainly by its pitch. By taking a right-handed rotation for example, for the right-handed rotated cholesteric liquid crystal whose pitch is close to the wavelength of the incident light, if a left-handed rotated light (a circularly polarized light in the left-handed rotation direction) is incident, light transmission occurs, and if a right-handed rotated light (a circularly polarized light in the right-handed rotation direction) is incident, light scattering which is the same with Bragg reflection occurs. The wide waveband reflective layer adopted in the present disclosure is formed by polymerizing a composition comprising the cholesteric liquid crystal, the polymerizable monomer, the right-handed rotated chiral compound and the photo-initiator. Cholesteric phase is one kind of the nematic phase, and by adding the chiral compound to the nematic liquid crystal, spirally arranged cholesteric liquid crystal can be obtained. By irradiating the composition within a temperature higher than the cholesteric phase and smectic A phase transition temperature of the liquid crystal by no more than 10 degrees with ultraviolet light, a wide waveband reflective cholesteric liquid crystal layer with a right-handed rotated pitch structure is obtained. By reflecting right-handed rotated light rays when no voltage is applied, a mirror effect is achieved, and a transparent optical layer is obtained when a voltage is applied.

For the wide waveband reflective composite layer, its transparent state represents a state in which all light rays can transmit therethrough when a voltage is applied. The mirror state represents a transflective state when no voltage is applied, wherein the reflected components can achieve a mirror effect.

In the embodiment of the present disclosure, the wide waveband reflective layer can be formed by polymerizing a composition comprising cholesteric liquid crystal of 70-98 wt % and polymerizable monomer of 2-30 wt %, and an additional photo-initiator that is 0.5-3 wt % of the polymerizable monomer. As described above, the cholesteric liquid crystal can be formed by adding to the nematic liquid crystal with a chiral compound of 0.5-10 wt %. The polymerizable monomer and the polymerization conditions can be the same with those in the above-mentioned with respect to the dichroic dye layer, and thus are omitted here.

In the embodiment of the present disclosure, the first liquid crystal display (LCD) composite layer comprises the substrate 1, the liquid crystal layer, the thin film transistor layer, and the substrate 2 stacked in this order.

In the embodiment of the present disclosure, the liquid crystal layer can be any type of liquid crystal known to those skilled in the art, such as those in twisted nematic (TN), super twisted nematic (STN), in-plane conversion (IPS), advanced super-dimensional field conversion (ADS) or vertical alignment (VA) modes.

For the first liquid crystal display (LCD) composite layer, its display state represents a state in which, under the action of different pixel voltages, the liquid crystal molecules of each pixel present different states, so that the light rays selectively transmit therethrough, or under the action of the color film (i.e., color filter) or not, a color or grayscale image can be presented as a whole, respectively. The transparent state represents a state in which regardless of a difference in the liquid crystal mode (at this time, whether or not a voltage is applied is related to the liquid crystal mode), the light can transmit through all the liquid crystal molecules. The dark state represents a state in which regardless of a difference in the liquid crystal mode, all the liquid crystal molecules can absorb light.

For example, in the case of the LCD in the TN mode, when no voltage is applied, the liquid crystal molecules are arranged in the alignment direction of the substrate, and polarized light rays from the outside (polarized light in the same direction with the substrate alignment direction) can transmit through the liquid crystal layer such that the display is fully lighted. At this time the liquid crystal layer can transmit backlight, namely in a transparent state. When a voltage is applied, the liquid crystal molecules are arranged in the direction of the electric field, so the incoming polarized light is absorbed, and a dark state is presented.

In the embodiment of the present disclosure, the organic light emitting diode (OLED) composite layer comprises a polarizer layer, a substrate 3, a first conductive layer, an organic light emitting diode layer, a second conductive layer, and a substrate 4 stacked in this order.

In another embodiment of the present disclosure, the organic light-emitting diode (OLED) composite layer comprises a substrate 3, a metal grid layer, an organic light emitting diode layer, a second conductive layer, and a substrate 4 stacked in this order. At this time, the metal grid layer has functions of both the conductive layer and the polarizer layer.

For the organic light emitting diode (OLED) composite layer, its light-emitting state represents a state in which a voltage is applied, the OLED layer emits light, whereby a lighting state is achieved. The transparent state represents a state in which no voltage is applied, the OLED layer does not emit light, and is in a transparent state.

Those skilled in the art could further add or omit some layers to or from the above-mentioned composite layers as needed, or appropriately adjust the order of the various layers, as long as the functional switching between the various layers is not affected.

For example, in the embodiment of the present disclosure, when displaying a color image, the first liquid crystal display (LCD) composite layer may further comprise a color film (color filter).

FIG. 2 is a schematic diagram showing a display state of the double-sided multifunctional device of the first aspect according to one or more embodiments of the present disclosure. Different display states of the embodiment are described in detail below with reference to FIG. 2.

State 1

In case where the OLED composite layer is in a lighting-emitting state (a voltage is applied), the LCD layer is in a display state, the dichroic layer is in a black polarization state (no voltage is applied), and the reflective layer is in a transparent state (a voltage is applied), after the light rays emitted by the OLED lighting layer pass through the metal grid, they become polarized, and reach the LCD layer via the reflective layer, but the light rays through the LCD layer are selectively transmitted or absorbed (due to polarization) by the dichroic layer, thereby displaying an image (on the upper side). On the lower side, the OLED lighting layer emits light directly, and thus has a lighting effect.

State 2

In case where the OLED composite layer is in a lighting state, the LCD layer is in a transparent state (fully transmitted), the dichroic layer is in a transparent state, and the reflective layer is in a transparent state, after the light rays emitted by the OLED lighting layer pass through the metal grid, they become polarized, and directly transmit through the reflective layer, the LCD layer and the dichroic layer, thereby forming a lighting state (on the upper side). On the lower side, the OLED lighting layer emits light directly, and thus has a lighting effect.

State 3

In case where the OLED composite layer is in a lighting-emitting state, the LCD layer is in a dark state, the dichroic layer is in a black state, and the reflective layer is in a mirror state, after the light rays emitted by the OLED lighting layer pass through the metal grid, they become polarized, and reach the reflective layer. Afterwards, a half of the light rays (right-handed rotated light) are reflected and together with the light rays on the lower side, are emitted toward the lower side of the OLED lighting layer, thereby forming a lighting state. The other half of the light rays (left-handed rotated light) reach the LCD layer and pass through it, and then these light rays are absorbed (due to polarization) by the dichroic layer, thereby forming a black state.

State 4

In case where the OLED composite layer is in a lighting-emitting state, the LCD layer is in a transparent state, the dichroic layer is in a transparent polarization state, and the reflective layer is in a mirror state, after the light rays emitted by the OLED lighting layer pass through the metal grid, they become polarized. Afterwards, a half of the light rays (right-handed rotated light) are reflected and together with the light rays on the lower side, are emitted toward the lower side of the OLED lighting layer, thereby forming a lighting state. The other half of the light rays (left-handed rotated light) directly transmit through the LCD layer and dichroic layer in a transparent state. Therefore, the light rays coining from the outside of the layer are reflected by the reflective layer, thereby forming a mirror state.

State 5

In case where the OLED composite layer is in a transparent state, the LCD layer is in a transparent state, the dichroic layer is in a transparent polarization state, and the reflective layer is in a mirror state, since all the layers other than the reflective layer are in a transparent state, after the light rays coming from the outside (upper and lower sides) reach the reflective layer, they are reflected, thereby forming a mirror state on both sides.

In some other embodiments of the present disclosure, on the basis of the above-mentioned embodiments, a second liquid crystal display composite layer with the same structure as the first liquid crystal display composite layer is further formed on the lower side of the substrate 4. In the embodiment of the present disclosure, both the first and second liquid crystal display composite layers are independently switchable between the display state, the transparent state and the dark state.

In an embodiment of the present disclosure, the second liquid crystal display (LCD) composite layer comprises a fifth substrate, a second liquid crystal layer, a second thin film transistor layer, a sixth substrate, and a first polarizer layer stacked in this order.

In the embodiment of the preset disclosure, when the double-sided multifunctional device comprises a second liquid crystal display (LCD) composite layer, the organic light emitting diode (OLED) composite layer comprises a third polarizer layer on the other side of the substrate 4.

In the embodiment of the present disclosure, similar to the first liquid crystal display (LCD) composite layer, when displaying a color image, the second liquid crystal display (LCD) composite layer may further comprise a color film (color filter).

In the embodiment of the present disclosure, when the double-sided multifunctional device comprises a second liquid crystal display (LCD) composite layer, the second conductive layer and the third polarizer layer of the organic light-emitting diode (OLED) composite layer on a substrate 4 side may be also replaced by a second metal grid layer.

The different display states in the embodiment are described below in detail.

Except for the fact that the second liquid crystal display (LCD) composite layer achieves a display state such that a display state is presented on the lower side of the double-sided multifunctional device, in States 1-4, the states on the upper side are the same with the states on the upper side in the previous embodiment.

Specifically, the following display states are presented.

State 1

In case where the OLED composite layer is in a lighting-emitting state (a voltage is applied), the first LCD layer is in a display state, the dichroic layer is in a black polarization state (no voltage is applied), the reflective layer is in a transparent state (a voltage is applied), and the second LCD layer is in a display state, after the light rays emitted by the OLED lighting layer pass through the metal grid, they become polarized, and reach the LCD layer via the reflective layer, but the light rays through the LCD layer are selectively transmitted or absorbed (due to polarization) by the dichroic layer, thereby displaying an image (on the upper side). On the lower side, the light rays emitted by the OLED lighting layer reach the LCD layer via the third polarizer layer, thereby displaying an image.

State 2

In case where the OLED composite layer is in a lighting state, the LCD layer is in a transparent state (fully transmitted), the dichroic layer is in a transparent state, the reflective layer is in a transparent state, and the second LCD layer is in a display state, after the light rays emitted by the OLED lighting layer pass through the metal grid, they become polarized, and directly transmit through the reflective layer, the LCD layer and the dichroic layer, thereby forming a lighting state (on the upper side). On the lower side, the light rays emitted by the OLED lighting layer reach the LCD layer via the third polarizer layer, thereby displaying an image.

State 3

In case where the OLED composite layer is in an lighting-emitting state, the LCD layer is in a dark state, the dichroic layer is in a black state, the reflective layer is in a mirror state, and the second LCD layer is in a display state, after the light rays emitted by the OLED lighting layer pass through the metal grid, they become polarized, and reach the reflective layer. Afterwards, a half of the light rays (right-handed rotated light) are reflected and together with the light rays on the lower side, are emitted toward the lower side of the OLED lighting layer, thereby forming a lighting state. After the other half of the light rays (left-handed rotated light) reach the LCD layer and pass through it, the light rays are absorbed (due to polarization) by the dichroic layer, thereby forming a black state. On the lower side, the light rays emitted by the OLED lighting layer reach the LCD layer via the third polarizer layer, thereby displaying an image.

State 4

In case where the OLED composite layer is in a lighting-emitting state, the LCD layer is in a transparent state, the dichroic layer is in a transparent polarization state, the reflective layer is in a mirror state, and the second LCD layer is in a display state, after the light rays emitted by the OLED lighting layer pass through the metal grid, they become polarized, and reach the LCD layer. Afterwards, a half of the light rays (right-handed rotated light) are reflected and together with the light rays on the lower side, are emitted toward the lower side of the OLED lighting layer, thereby forming a lighting state. The other half of the light rays (left-handed rotated light) directly transmit through the LCD layer and dichroic layer in a transparent state. Therefore, the light rays coining from the outside of the layer are reflected by the reflective layer, thereby forming a mirror state. On the lower side, the light rays emitted by the OLED lighting layer reach the LCD layer via the third polarizer layer, thereby displaying an image.

In the embodiment of the present disclosure, when the double-sided multifunctional device comprises a second liquid crystal display (LCD) composite layer, the double-sided multifunctional device can also achieve States 1-5 in the double-sided multifunctional device according to the previous embodiment of the present disclosure, wherein it is only needed to switch the second liquid crystal display (LCD) composite layer into a transparent state, and detailed states of the various layers are omitted here.

In above method of manufacturing the double-sided multifunctional device, the said "upper side" and "lower side" only represent a relative position, and those skilled in the art would appreciate that, even if the said "upper side" and "lower side" are interchanged, or they are correspondingly replaced with "left side" and "right side" or other words showing a relative position, they still represent the same meanings.

What is claimed is:

1. A device comprising a dichroic dye composite layer, a first liquid crystal display composite layer, a wide waveband reflective composite layer and an organic light emitting diode composite layer stacked in this order, wherein the dichroic dye composite layer is switchable between a black state and a transparent state, the first liquid crystal display composite layer is switchable between a display state, a transparent state and a dark state, the wide waveband reflective composite layer is switchable between a transparent state and a mirror state, and the organic light emitting diode composite layer is switchable between a light-emitting state and a transparent state, wherein the dichroic dye composite layer comprises a dichroic dye layer and dichroic dye layer transparent electrodes on both sides thereof, and wherein the wide waveband reflective composite layer comprises a wide waveband reflective layer and wide waveband reflective layer transparent electrodes on both sides thereof.

2. The device according to claim 1, further comprising a second liquid crystal display composite layer which is successively stacked, wherein both the first and second liquid crystal display composite layers are independently switchable between the display state, the transparent state and the dark state.

3. The device according to claim 1, wherein the dichroic dye layer is formed by polymerizing a composition comprising nematic liquid crystal of 40-80 wt %, polymerizable monomer of 19.5-59.5 wt %, dichroic dye of 0.5-10 wt %, and a photo-initiator that is 0.5-3 wt % of the polymerizable monomer.

4. The device according to claim 2, wherein the dichroic dye layer is formed by polymerizing a composition comprising nematic liquid crystal of 40-80 wt %, polymerizable monomer of 19.5-59.5 wt %, dichroic dye of 0.5-10 wt %, and a photo-initiator that is 0.5-3 wt % of the polymerizable monomer.

5. The device according to claim 1, wherein
the wide waveband reflective layer is formed by polymerizing a composition comprising cholesteric liquid crystal of 70-98 wt % and polymerizable monomer of 2-30 wt %, and an additional photo-initiator that is 0.5-3 wt % of the polymerizable monomer, wherein the cholesteric liquid crystal is formed by adding to a nematic liquid crystal with a chiral compound of 0.5-10 wt %.

6. The device according to claim 2, wherein
the wide waveband reflective layer is formed by polymerizing a composition comprising cholesteric liquid crystal of 70-98 wt %, polymerizable monomer of 2-30 wt %, and a photo-initiator that is 0.5-3 wt % of the polymerizable monomer, wherein the cholesteric liquid crystal is formed by adding to a nematic liquid crystal with a chiral compound of 0.5-10 wt %.

7. The device according to claim 1, wherein
the first liquid crystal display composite layer comprises a first substrate, a first liquid crystal layer, a first thin film transistor layer, and a second substrate stacked in this order.

8. The device according to claim 1, wherein
the first liquid crystal display composite layer comprises a first substrate, a color film, a first liquid crystal layer, a first thin film transistor layer, and a second substrate stacked in this order.

9. The device according to claim 2, wherein
the second liquid crystal display composite layer comprises a fifth substrate, a second liquid crystal layer, a second thin film transistor layer, a sixth substrate, and a first polarizer layer stacked in this order.

10. The device according to claim 7, wherein
The first or second liquid crystal layer is in a twisted nematic, super twisted nematic, in-plane conversion, advanced super-dimensional field conversion or vertical alignment modes.

11. The device according to claim 8, wherein
The first or second liquid crystal layer is in a twisted nematic, super twisted nematic, in-plane conversion, advanced super-dimensional field conversion or vertical alignment modes.

12. The device according to claim 9, wherein
The first or second liquid crystal layer is in a twisted nematic, super twisted nematic, in-plane conversion, advanced super-dimensional field conversion or vertical alignment modes.

13. The device according to claim 1, wherein
the organic light emitting diode composite layer comprises a second polarizer layer, a third substrate, a first conductive layer, an organic light emitting diode layer, a second conductive layer, and a fourth substrate stacked in this order.

14. The device according to claim 1, wherein
the organic light emitting diode composite layer comprises a third substrate, a metal grid layer, an organic light emitting diode layer, a second conductive layer, and a fourth substrate stacked in this order.

15. The device according to claim 2, wherein
the organic light emitting diode composite layer comprises a second polarizer layer, a third substrate, a first conductive layer, an organic light emitting diode layer, a second conductive layer, a fourth substrate, and a third polarizer layer stacked in this order.

16. The device according to claim 2, wherein
the organic light emitting diode composite layer comprises a third substrate, a first metal grid layer, an organic light emitting diode layer, a second metal grid layer, and a fourth substrate stacked in this order.

17. An operation method of the device according to claim 1, comprising at least one of:
switching the dichroic dye composite layer to a black state, switching the first liquid crystal display composite layer to a display state, switching the wide waveband reflective composite layer to a transparent state, and switching the organic light emitting diode composite layer to a light-emitting state, such that a display state is achieved on a first liquid crystal display composite layer side, and a lighting state is achieved on an organic light emitting diode composite layer side;
switching the dichroic dye composite layer to a transparent state, switching the first liquid crystal display composite layer to a transparent state, switching the wide waveband reflective composite layer to a transparent state, and switching the organic light emitting diode composite layer to a light-emitting state, such that a lighting state is achieved on a first liquid crystal display composite layer side, and a lighting state is achieved on an organic light emitting diode composite layer side;
switching the dichroic dye composite layer to a black state, switching the first liquid crystal display composite layer to a dark state, switching the wide waveband reflective composite layer to a mirror state, and switching the organic light emitting diode composite layer to a light-emitting state, such that a black state is achieved on a first liquid crystal display composite layer side, and a lighting state is achieved on an organic light emitting diode composite layer side;
switching the dichroic dye composite layer to a transparent state, switching the first liquid crystal display composite layer to a transparent state, switching the wide waveband reflective composite layer to a mirror state, and switching the organic light emitting diode composite layer to a light-emitting state, such that a mirror state is achieved on a first liquid crystal display composite layer side, and a lighting state is achieved on an organic light emitting diode composite layer side; or
switching the dichroic dye composite layer to a transparent state, switching the first liquid crystal display composite layer to a transparent state, switching the wide waveband reflective composite layer to a mirror state, and switching the organic light emitting diode composite layer to a transparent state, such that a mirror state is achieved on a first liquid crystal display composite layer side, and a mirror state is achieved on an organic light emitting diode composite layer side.

18. An operation method of the device according to claim 2, comprising at least one of:
switching the dichroic dye composite layer to a black state, switching the first liquid crystal display composite layer to a display state, switching the wide waveband reflective composite layer to a transparent state, switching the organic light emitting diode composite layer to a light-emitting state, and switching the second liquid crystal display composite layer to a display state, such that a display state is achieved on a first liquid crystal display composite layer side, and a display state independent from a first liquid crystal display composite layer side is achieved on a second liquid crystal display composite layer side;
switching the dichroic dye composite layer to a transparent state, switching the first liquid crystal display composite layer to a transparent state, switching the wide waveband reflective composite layer to a transparent state, switching the organic light emitting diode composite layer to a light-emitting state, and switching the second liquid crystal display composite layer to a display state, such that a lighting state is achieved on a first liquid crystal display composite layer side, and a display state is achieved on a second liquid crystal display composite layer side;
switching the dichroic dye composite layer to a black state, switching the first liquid crystal display composite layer to a dark state, switching the wide waveband reflective composite layer to a mirror state, switching the organic light emitting diode composite layer to a light-emitting state, and switching the second liquid crystal display composite layer to a display state, such that a black state is achieved on a first liquid crystal display composite layer side, and a display state is achieved on a second liquid crystal display composite layer side; or
switching the dichroic dye composite layer to a transparent state, switching the first liquid crystal display composite layer to a transparent state, switching the wide waveband reflective composite layer to a mirror state, switching the organic light emitting diode composite layer to a light-emitting state, and switching the second liquid crystal display composite layer to a display state, such that a mirror state is achieved on a first liquid crystal display composite layer side, and a display state is achieved on a second liquid crystal display composite layer side.

19. A method of manufacturing the device according to claim 1, the method comprising:

forming a first thin film transistor on an upper side of a second substrate;

providing a dichroic dye composite layer on an upper side of a first substrate, wherein the first substrate is above the second substrate;

providing a transparent electrode and an alignment layer on both sides of the first substrate and the second substrate which face each other, and perfusing a nematic liquid crystal layer therebetween;

providing a wide waveband reflective composite layer on a lower side of the second substrate;

providing a third substrate on a lower side of the wide waveband reflective composite layer;

providing a first metal grid layer on a lower side of the third substrate;

providing an OLED lighting layer on a lower side of the first metal grid layer; and providing a fourth substrate on a lower side of the OLED lighting layer.

* * * * *